United States Patent
Yu et al.

(10) Patent No.: US 10,547,011 B2
(45) Date of Patent: Jan. 28, 2020

(54) PRINTED HALIDE PEROVSKITE LIGHT-EMITTING DIODES AND METHOD OF MANUFACTURE

(71) Applicant: The Florida State University Research Foundation, Inc., Tallahassee, FL (US)

(72) Inventors: Zhibin Yu, Tallahassee, FL (US); Sri Ganesh Rohit Bade, Tallahassee, FL (US); Xin Shan, Tallahassee, FL (US); Junqiang Li, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/968,258

(22) Filed: May 1, 2018

(65) Prior Publication Data
US 2018/0248135 A1 Aug. 30, 2018

Related U.S. Application Data

(63) Continuation of application No. PCT/US2016/059450, filed on Oct. 28, 2016.
(Continued)

(51) Int. Cl.
*H01L 51/00* (2006.01)
*H01L 51/50* (2006.01)
*H01L 51/52* (2006.01)

(52) U.S. Cl.
CPC ...... *H01L 51/0077* (2013.01); *H01L 51/0022* (2013.01); *H01L 51/0023* (2013.01);
(Continued)

(58) Field of Classification Search
CPC ............. H01L 51/0077; H01L 51/0022; H01L 51/0023; H01L 51/5012; H01L 51/5221; H01L 51/0004
See application file for complete search history.

(56) References Cited

U.S. PATENT DOCUMENTS

2003/0186522 A1 10/2003 Duan et al.
2005/0003645 A1 1/2005 Hirai
(Continued)

FOREIGN PATENT DOCUMENTS

JP 2015-141944 A 8/2015
WO 2015159192 A1 10/2015

OTHER PUBLICATIONS

Green et al., The emergence of perovskite solar cells. Nat. Photonics. 2014. vol. 8: 506-514.
(Continued)

*Primary Examiner* — Victor A Mandala
*Assistant Examiner* — Colleen E Snow
(74) *Attorney, Agent, or Firm* — Eversheds Sutherland (US) LLP

(57) ABSTRACT

Printed poly(ethylene oxide) (PEO) organometallic halide Perovskite (Pero) optoelectronic devices, including light emitting diodes (LEDs) fabricated on both rigid indium tin oxide (ITO)/glass and flexible carbon nanotube (CNTs)/polymer substrates using a composite thin film of PEO and Br-Pero as the light-emitting layer. Method of manufacturing Printed poly(ethylene oxide) (PEO) organometallic halide Perovskite (Pero) optoelectronic devices performed in an environment at a temperature of about 25° C. and a relative humidity between about 70% and 80%.

20 Claims, 12 Drawing Sheets

Related U.S. Application Data

(60) Provisional application No. 62/250,535, filed on Nov. 4, 2015.

(52) U.S. Cl.
CPC ...... *H01L 51/5012* (2013.01); *H01L 51/5221* (2013.01); *H01L 51/0004* (2013.01)

(56) References Cited

U.S. PATENT DOCUMENTS

| | | |
|---|---|---|
| 2008/0238882 A1 | 10/2008 | Sivarajan et al. |
| 2015/0030783 A1 | 1/2015 | Suganuma et al. |
| 2016/0268510 A1* | 9/2016 | Moon ................... H01L 51/424 |

OTHER PUBLICATIONS

Kazim et al, Perovskite as light harvester: a game changer in photovoltaics. Angew. Chem. Int. Ed. 2014. vol. 53: 2812-2824.

Dong et al., Solar cells_ Electron-hole diffusion lengths > 175 μm in solution-grown CH3NH3PbI3 single crystals. Science. 2015. vol. 347 (Issue 6225): 967-970.

Tan et al., Bright light-emitting diodes based on organometal halide perovskite. Nat. Nanotechnol. 2014. vol. 9: 387-692.

Zhou et al., Interface engineering of highly efficient perovskite solar cells. Science. 2014. vol. 345 (Issue 6196): 542-546.

Xing et al., Low-temperature solution-processed wavelength-tunable perovskites for lasing. Nat. Mater. 2014. vol. 13: 476-480.

Zhang et al., Brightly Luminescent and Color-Tunable Colloidal CH3NH3PbX3 (X=Br, I, Cl) Quantum Dots: Potential Alternatives for Display Technology. ACS Nano 2015. vol. 9 (No. 4): 4533-4542.

Chondroudis and Mitzi. Electroluminescence from an Organic— Inorganic Perovskite Incorporating a Quaterthiophene Dye within Lead Halide Perovskite Layers. Chem. Mater 1999. vol. 11: 3028-3030.

Era et al., Organic-inorganic heterostructure electroluminescent device using a layered perovskite semiconductor (C6H5C2H4NH3)2PbI4. Appl. Phys. Lett. 1994. vol. 65 (No. 6): 676-678.

Hattori et al., Highly efficient electroluminescence from a heterostructure device combined with emissive layered-perovskite and an electron-transporting organic compound Chem. Phys. Lett. 1996. vol. 254: 103-108.

Hoye et al., Enhanced performance in fluorene-free organometal halide perovskite light-emitting diodes using tunable, low electron affinity oxide electron injectors. Adv. Mater. 2015. vol. 27: 1414-1419.

Kim et al., Multicolored organic/inorganic hybrid perovskite light-emitting diodes. Adv. Mater. 2015. vol. 27: 1248-1254.

Li et al., Efficient light-emitting diodes based on nanocrystalline perovskite in a dielectric polymer matrix. Nano Lett. 2015. vol. 15: 2640-2644.

Yu et al., High-Performance Planar Perovskite Optoelectronic Devices: A Morphological and Interfacial Control by Polar Solvent Treatment. Adv. Mater. 2015. vol. 27: 3492-3500.

Aygüler et al, Light-Emitting Electrochemical Cells Based on Hybrid Lead Halide Perovskite Nanoparticles. J. Phys. Chem. C. 2015. vol. 119: 12047-12054.

Wang et al., Interfacial control toward efficient and low-voltage perovskite light-emitting diodes. Adv. Mater. 2015. vol. 27: 2311-2316.

Tang et al., Organic electroluminescent diodes. Appl. Phys. Lett. 1987. vol. 51 (No. 12): 913-915.

Gustafsson et al., Flexible light-emitting diodes made from soluble conducting polymers. Nature 1992. vol. 357: 477-479.

Walzer et al., Highly Efficient Organic Devices Based on Electrically Doped Transport Layers. Chem. Rev. 2007. vol. 107: 1233-1271.

Watanabe et al., High-Efficiency Phosphorescent OLEDs using Chemically Doped Layers. J. Photopolym. Sci. Technol. 2005. vol. 18 (No. 1): 83-86.

Xiao et al., Giant switchable photovoltaic effect in organometal trihalide perovskite devices Nat. Mater. 2015. vol. 14: 193-198.

Armstrong et al., Light-emitting electrochemical processes. Annu. Rev. Phys. Chem. 2001. vol. 52: 391-422.

Chen et al., Single-layer triplet white polymer light-emitting diodes incorporating polymer oxides: Effect of charge trapping at phosphorescent dopants. Applied Physics Letters. 2009. vol. 94: 043306.

International Search Report and Written Opinion for PCT/US16/ 36386 (filing date: Jun. 8, 2016) dated Sep. 6, 2016; Applicant: The Florida State University Research Foundation, Inc.

International Preliminary Report on Patentability for PCT/US2016/ 036386 (filing date: Jun. 8, 2016) with a priority date of Jun. 8, 2015; Applicant: The Florida State University Research Foundation, Inc.

Li et al, Single-Layer Light-Emitting Diodes Using Organometal Halide Perovskite/Poly(ethylene oxide) Composite Thin Films. Advanced Materials. 2015. vol. 27 (35): 5196-5202.

Translation of Japanese Publication No. JP2015141944A (filing date: Jan. 27, 2014) with a publication date of Aug. 3, 2015; Assignee: Konica Minolta Inc.

International Search Report and Written Opinion for PCT/US16/ 59450 (filing date: Oct. 28, 2016) dated Feb. 15, 2017; Applicant: The Florida State University Research Foundation, Inc.

International Preliminary Report on Patentability for PCT/US2016/ 059450 (filing date: Oct. 28, 2016) with a priority date of Nov. 4, 2015; Applicant: The Florida State University Research Foundation, Inc.

* cited by examiner

As-prepared

After 20 hours air exposure

PRINTED HALIDE PEROVSKITE LIGHT-EMITTING DIODES AND METHOD OF MANUFACTURE

CROSS-REFERENCE TO RELATED APPLICATIONS

This application is a continuation of and claims priority to International Patent Application No. PCT/US2016/059450, filed Oct. 28, 2016 which claims priority to U.S. Provisional Patent Application No. 62/250,535 filed on Nov. 4, 2015 and entitled, "Fully Printed Halide Perovskite Light-Emitting Diodes with Silver Nanowire Electrodes", the contents of which are herein incorporated by reference.

BACKGROUND OF THE INVENTION

Organometal halide Perovskites (Peros) have recently been discovered to have remarkable optoelectronic properties, eliciting research into their potential as photovoltaic and light-emitting diodes (LEDs). Pero LEDs offer many advantages, including high efficiencies, low processing temperatures, cost-effectiveness and scalable fabrication processes. For Pero solar cells, the highest power conversion efficiency has reached about 20%, which approaches the best efficiencies of copper indium, gallium selenide and cadmium telluride based thin film solar cells.

Most reported Pero-based LEDs have a multi-layer device architecture comprising, at a minimum, a Pero emissive layer, an electron transport layer (ETL), to assist electron injection across the Pero/cathode interface and a hole transport layer (HTL), to enhance hole injection across the Pero/anode side of the device. The use of an HTL and ETL has been shown to lower the hole/electron injection barriers, resulting in low operating voltage and high electroluminescence efficiency in OLEDs and quantum-dot LEDs. However, the multi-layer device architecture of Pero-based LEDs currently known in the art requires very complex fabrication steps that are not compatible with large scale printing processes.

Accordingly, what is needed in the art are Pero-based solar cells and Pero-based LEDs which utilize a scalable printing technique to fulfill the promise of large scale, low cost devices.

BRIEF SUMMARY OF THE INVENTION

A single layer of poly(ethylene oxide) (PEO)/Pero composite thin film sandwiched between an indium tin oxide (ITO) anode and a gold (or an indium/gallium eutectic alloy) cathode can generate efficient electroluminescence without requiring the use of an electron transportation layer (ETL) or a hole transportation layer (HTL). The simplified, single-layer device architecture and the use of a high work function cathode are both desirable for printable Pero devices that can be fabricated in ambient air.

In accordance with various embodiment of the present invention, a method for manufacturing an optoelectronic device is provided. The method includes, placing a poly (ethylene oxide) (PEO) organometallic halide Perovskite (Pero) solution onto a transparent electrode substrate, spreading the PEO/Pero solution substantially uniformly across at least a portion of the transparent electrode substrate to form an emissive layer on the transparent electrode substrate. The method further includes, positioning a contact mask in overlying relation to the emissive layer, the contact mask dimensioned and patterned to define a patterned electrode, placing a metallic nanowire solution onto the contact mask and, spreading the metallic nanowire solution substantially uniformly across the contact mask to form the patterned electrode on the emissive layer.

By utilizing a PEO/Pero solution to form the emission layer, the present invention allows for the fabrication of the optoelectronic devices in an environment having a temperature of about 25° C. and a relative humidity between about 70% and 80%.

In an exemplary embodiment, the transparent electrode substrate comprises an indium tin oxide (ITO) electrode on a glass substrate. In another exemplary embodiment, the transparent electrode substrate comprises a carbon nanotube (CNT) electrode on a polyacrylate substrate.

In order to remove the solvent from the solutions during the manufacturing process, the method may further include, annealing the PEO/Pero solution after spreading the PEO/Pero solution substantially uniformly across at least a portion of the transparent electrode substrate to remove a solvent from the PEO/Pero solution and annealing the metallic nanowire solution after spreading the metallic nanowire solution substantially uniformly across the contact mask to form the patterned electrode on the emissive layer to remove a solvent from the metallic nanowire solution.

In an additional embodiment, the present invention provides a optoelectronic device which includes, a transparent electrode substrate, a substantially uniform printed poly (ethylene oxide) (PEO) organometallic halide Perovskite (Pero) emissive layer on the transparent electrode substrate and a substantially uniform printed and patterned electrode on the emissive layer. In a particular embodiment, a ratio of PEO to Pero in the PEO/Pero solution is about 0.75:1.

The present disclosure comprises the first printed Pero-based LEDs on both rigid ITO/glass and flexible carbon nanotubes (CNTs)/polymer substrates. The printing process can be carried out in ambient air without any deliberate control of humidity, and it was found that printing the PEO/Br-Pero in air could actually improve its photoluminescence properties. On average, 256% enhancement in luminous efficiency and 484% enhancement in maximum luminance intensity were observed in the Pero-based LEDs printed in air compared to those printed in a dry nitrogen atmosphere. Such results represent a significant and unexpected improvement over the existing Pero LEDs in the literature which require a multi-layer device structure, a spin-coated Pero thin film, and a vacuum-evaporated metal electrode.

The long-standing but heretofore unfulfilled need for printable Pero-based LEDs on both rigid ITO/glass and flexible carbon nanotubes (CNTs)/polymer substrates, and methods of manufacture for these LEDs is now met by a new, useful, and nonobvious invention.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
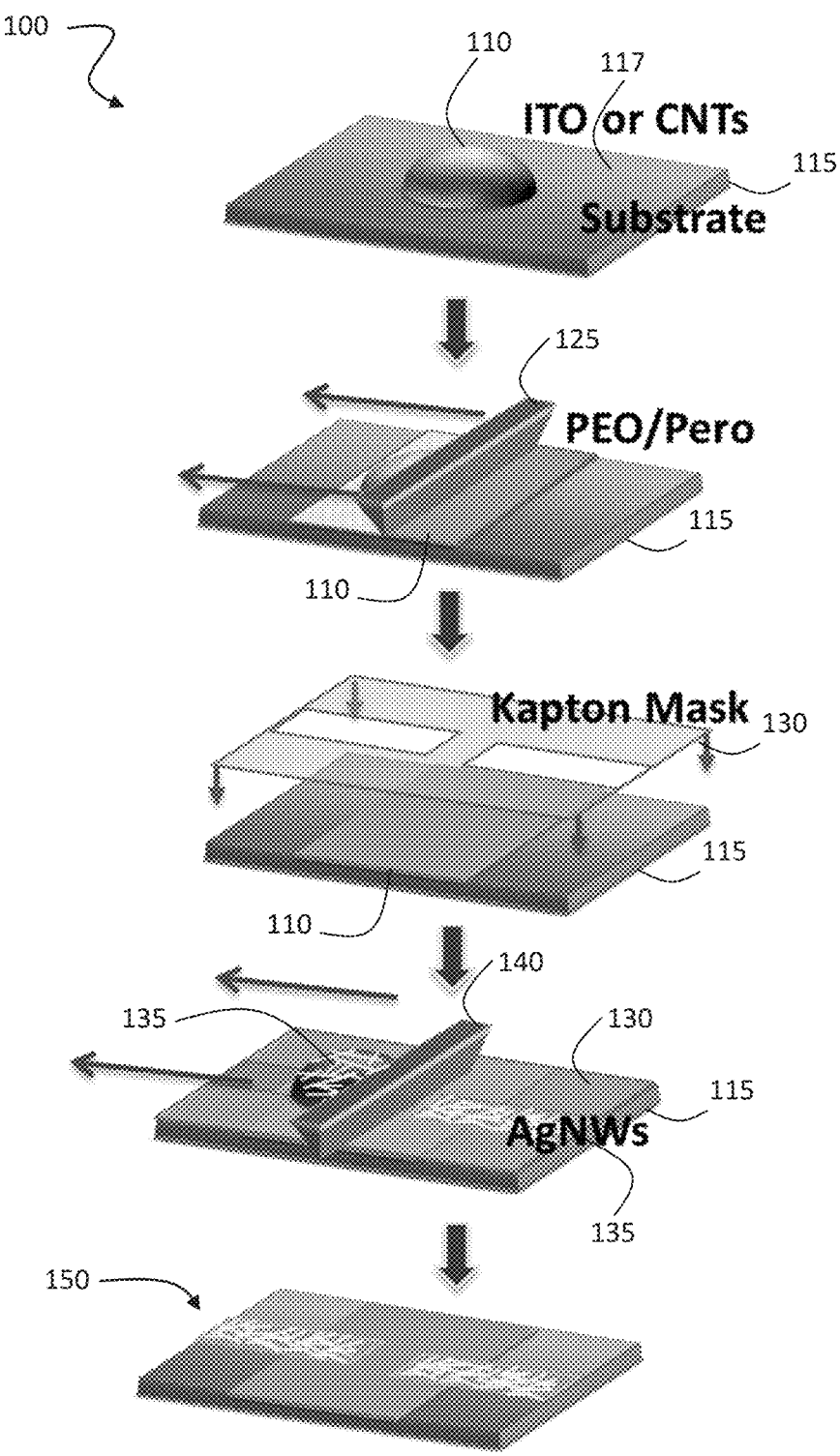
FIG. 1 is illustration of the method steps for manufacturing a printed PEO/Br-Pero LEDs, in accordance with an embodiment of the present invention.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

Organometal halide Perovskites (Peros) are materials with an $ABX_3$ crystal structure resembling that commonly found in barium titanate ($BaTiO_3$). More specifically, in Peros, A is a cesium ($Cs^+$) or an aliphatic ammonium ($RNH_3^+$) cation, B is a divalent cation of lead ($Pb^{2+}$) or tin ($Sn^{2+}$), and X is an anion such as chloride ($Cl^-$), iodide ($I^-$) or bromide ($Br^-$). Organometallic halide Perovskites (Pero) have a great potential for next generation large area, high performance optoelectronic devices.

In prior art Pero-based solar cells and Pero-based LEDs a multi-layer device architecture is commonly used that includes a Pero layer, an electron transportation layer (ETL), to assist electron collection or injection across the Pero/cathode interface, and a hole transportation layer (HTL), to enhance hole collection or injection at the Pero/anode side. While such a multi-layer approach has been shown to benefit device performance, the multi-layer approach also requires complex fabrication techniques, the undesirable use of orthogonal solvents and an electron transportation layer that is reactive in air for the printing processes.

In accordance with various embodiments of the present invention, a printed Pero light emitting diode (LED) may be fabricated on either a rigid indium tin oxide (ITO)/glass substrate or a flexible carbon nanotubes (CNTs)/polymer substrate. The printed Pero optoelectronic devices of the present invention may include ITO or CNTs as the transparent anode, a printed composite film consisting of methyl ammonium lead tri-bromide (Br-Pero) and poly(ethylene oxide) (PEO) as the emissive layer, and printed silver nanowires as the cathode. In contrast with the prior art, the printing process for fabricating the Pero devices can be carried out in ambient air without any deliberate control of humidity, and it has been found, contrary to expectations, that printing the PEO/Br-Pero device in air may actually improve its photoluminescence properties.

The printed devices in accordance with present invention have been found to exhibit a low turn-on voltage of about 2.6 V (defined at 1 cd m$^{-2}$), a luminance intensity of about 21,014 cd m$^{-2}$ and an external quantum efficiency (EQE) of about 1.1%, thereby representing a new state-of-the-art in Pero LEDs. The metrics of the inventive PEO/Br-Pero LEDs exceed existing Pero LEDs having a multi-layer device structure and as such, requiring a more complex fabrication technique. Accordingly, the new material and processing concepts in accordance with the present invention may be useful for future scalable manufacturing of Pero-based optoelectronic devices.

FIG. 1 illustrates the fabrication steps 100 of a printed Pero-based LED, in accordance with an exemplary embodiment of the present invention. In a first step, a mixture solution of poly(ethylene oxide) (PEO) and methyl ammonium lead tri-bromide (Br-Pero) in dimethylformamide (DMF) 110 is deposited onto a cleaned substrate 115 comprising a transparent anode layer 117. In one embodiment the transparent anode layer 117 may be indium tin oxide (ITO) anode and the substrate 115 may be a glass substrate. In another embodiment, the transparent anode layer 117 may comprise carbon nanotubes (CNTs) and the substrate 115 may be a polymer material.

During the next fabrication step the mixture solution of PEO and Br-Pero 110 is then spread substantially uniformly using a blade 125 and then annealed at 80° C. for five minutes to allow the dimethylformamide solvent to completely evaporate from the mixture solution.

Following the uniform spreading of the PEO and Br-Pero 110, a contact mask 130 is then used to define the size and pattern of the active area for the device. In one embodiment the contact mask 130 may be fabricated from a polyimide film, such as Kapton film. After the contact mask 130 is in place, silver nanowires (AgNWs) 135 dispersed in isopropanol (IPA) are then deposited onto the contact mask 130 and spread substantially uniformly over the contact mask 130 using another blade 140. Following a one minute baking at 80° C. to evaporate the IPA solvent, the contact mask 130 is removed and the Pero-based device 150 is complete.

Figure 2A:
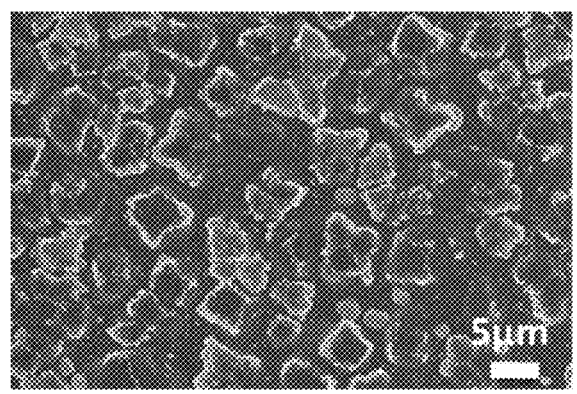
FIG. 2A is a top view scanning electron microscope (SEM) image of a PEO/Br-Pero composite film (0.75:1), in accordance with an embodiment of the present invention.
Figure 2B:
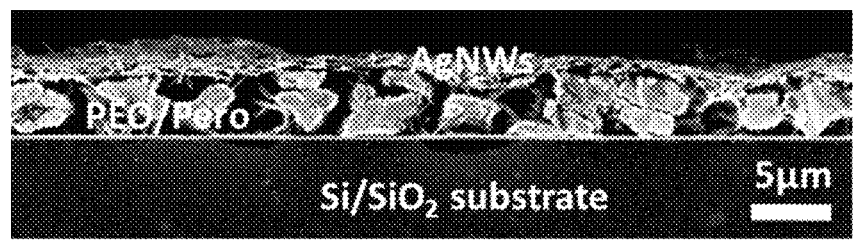
FIG. 2B is a cross-sectional SEM image of a PEO/Br-Pero (0.75:1) emissive layer and AgNW double layer printed onto a silicon/silicon dioxide wafer, in accordance with an embodiment of the present invention.
Figure 2C:
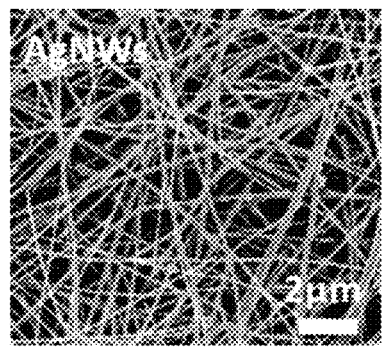
FIG. 2C is a top view SEM image of an AgNW electrode, in accordance with an embodiment of the present invention.

The exemplary LEDs fabricated with the above outlined process 100 provided a lighting are of about 3 mm×3 mm. FIG. 2A is a top view scanning electron microscope (SEM) image of a PEO/Br-Pero composite film (0.75:1), in accordance with an embodiment of the present invention. FIG. 2B is a cross-sectional SEM image of a PEO/Br-Pero (0.75:1) emissive layer and AgNW double layer printed onto a silicon/silicon dioxide wafer, in accordance with an embodiment of the present invention. FIG. 2C is a top view SEM image of an AgNW electrode, in accordance with an embodiment of the present invention. FIG. 2A-FIG. 2C reveal good uniformity of both the printed PEO/Br-Pero composite film and the printed AgNw electrodes. The cross-sectional SEM image of the PEO/Br-Pero (0.75:1) emissive layer and AgNW double layer printed onto a silicon/silicon dioxide wafer, shown in FIG. 2B, reveals a PEO/Br-Pero composite layer of 3-4 µm thick and a conformal AgNW coating about 300 nm thick. The Pero crystals were partially embedded in the polymer matrix with both size and spatial distribution matching the SEM image in FIG. 2A. The SEM top view image of the AgNW electrode in FIG. 2C further clarifies a dense network structure of the printed AgNWs on top of the PEO/Br-Pero film, ensuring low series resistance in the LEDs. In one embodiment, the fabricated device emitted uniform green light with 2,400 cd m$^{-2}$ luminance intensity. In another embodiment, the fabricated device emitted ~300 cd m$^{-2}$ green light at a 3.2V bias. LEDs emitting light having various shapes can be fabricated by changing the contact masks for the AgNW printing step. Additionally, a device fabricated on a flexible CNT/polymer substrate may be subjected to bending and in a particular embodiment the device may be bent to 5 mm radius of convex curvature.

Figure 3A:
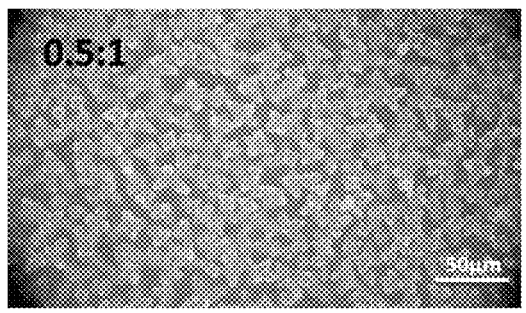
FIG. 3A is an optical microscopic image of a printed PEO/Br-Pero film with PEO to Pero weight ratio of 0.5:1, in accordance with an embodiment of the present invention.
Figure 3B:
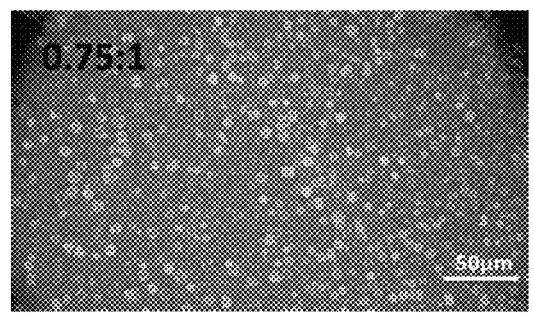
FIG. 3B is an optical microscopic image of a printed PEO/Br-Pero film with PEO to Pero weight ratio of 0.75:1, in accordance with an embodiment of the present invention.
Figure 3C:
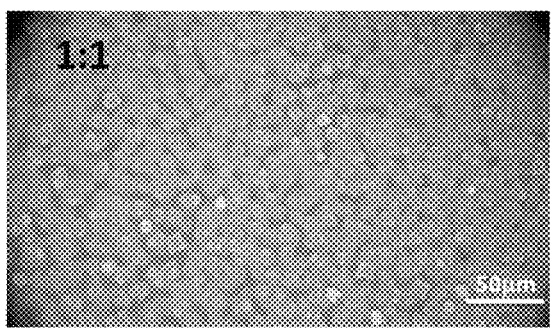
FIG. 3C is an optical microscopic image of a printed PEO/Br-Pero film with PEO to Pero weight ratio of 1:1, in accordance with an embodiment of the present invention.

FIG. 3A-FIG. 3D illustrate the optical microscopic images of the printed PEO/Br-Pero films with PEO to Pero weight ratios of 0.5:1, 0.75:1 and 1:1, respectively. This is not intended to be limiting and other PEO to Pero weight ratios are within the scope of the present invention. In various embodiments, the Pero-based films may be fabricated in ambient air at approximately 25° C. and at about 70-85% relative humidity. Under these conditions, dendritic Pero crystals of about 20-30 µm size were shown to form at 0.5:1 composition and the crystals were separated from each other by about 10-20 µm, as shown in FIG. 3A, wherein, ~60% of the total area is covered by Pero. At higher PEO concentrations (0.75:1 and 1:1), as shown in FIGS. 3B and 3C, respectively, the Br-Pero crystals evolved into a cuboid shape, and the separation between neighboring crystals became much smaller. The finest grain size (5 µm) and highest Pero coverage (~90%) were obtained in the 0.75:1 film, thus this composition was used for the LEDs described in a later sections.

Figure 3D:
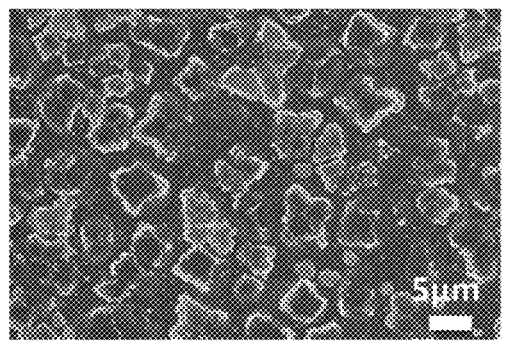
FIG. 3D is an optical microscopic image illustrating the spacing between the Pero crystals, in accordance with an embodiment of the present invention.
Figure 4:
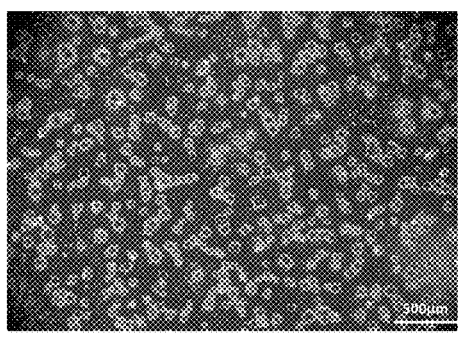
FIG. 4 is an optical microscopic image of a Br-Pero film printed in air without adding PEO.

The morphology of the 0.75:1 film was further examined by scanning electron microscope (SEM) as shown in FIG. 3D. It can be seen in FIG. 3D, the spacing between the Pero crystals has been fully filled with PEO polymer, and the PEO/Br-Pero composite film is continuous and pin-hole free. In contrast, as shown in FIG. 4, only 20-30% surface coverage was obtained when the Pero solution was printed in air without adding PEO. This observation is consistent with previous reports where moisture was found to play an important role in the crystallization of methyl ammonium lead tri-iodide (I-Pero) from a solution phase. Very poor coverage was consistently seen when the Pero was processed above ~50% relative humidity. In this regard, the composite approach (i.e. PEO/Br-Pero) in the present disclosure is advantageous to eliminating the catastrophic effect of high humidity on the obtained compact emissive layer, which is crucial for preventing electrical shortage and achieving high device yield after printing the top AgNW electrode from solution.

Figure 5A:
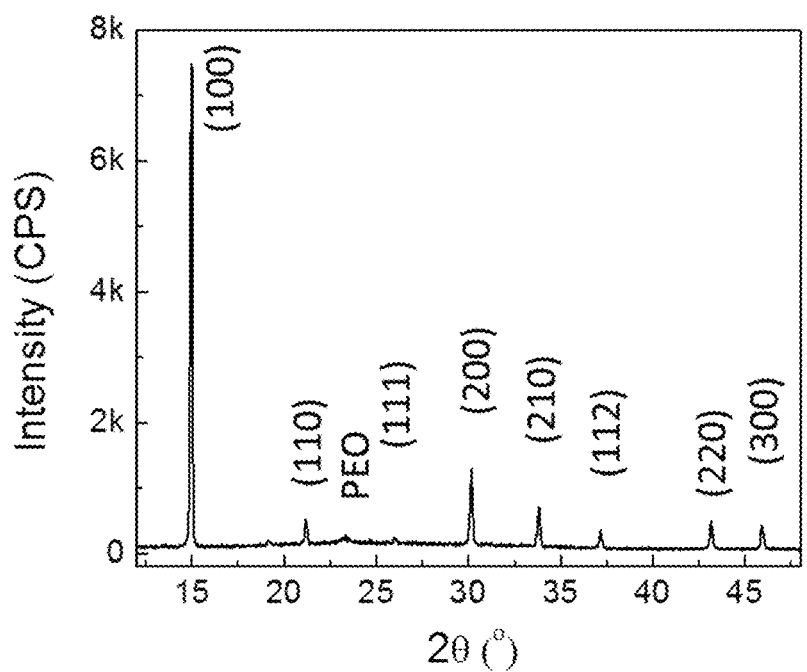
FIG. 5A is a X-ray diffraction pattern of PEO/Br-Pero composite film (0.75:1), in accordance with an embodiment of the present invention.
Figure 5B:
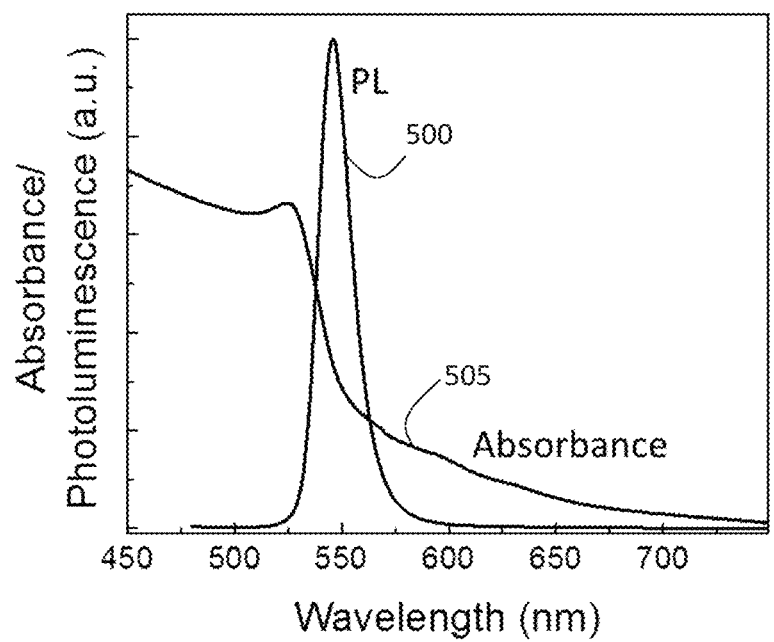
FIG. 5B is an absorbance and photoluminescence spectrum of PEO/Br-Pero composite film (0.75:1), in accordance with an embodiment of the present invention.
Figure 6:
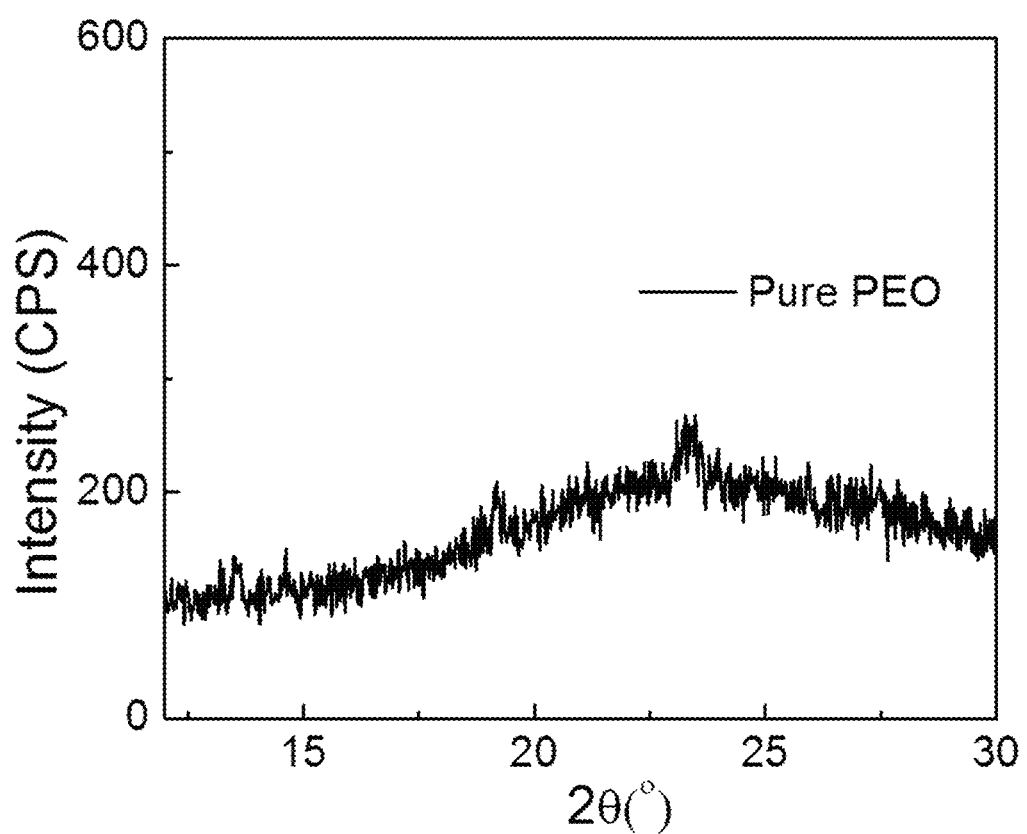
FIG. 6 is an X-ray diffraction pattern of a pure PEO film, in accordance with an embodiment of the present invention.

The crystallinity of Pero in the PEO matrix was further verified by X-ray diffraction (XRD). In one embodiment, the film showed the characteristic peaks of Br-Pero as indexed in FIG. 5A and FIG. 5B for the 0.75:1 composite film, affirming the presence of Br-Pero crystals. FIG. 4A is a X-ray diffraction pattern of PEO/Br-Pero composite film (0.75:1). FIG. 4B illustrates an absorbance spectrum 505 and a photoluminescence spectrum 500 of an exemplary PEO/Br-Pero composite film (0.75:1). The peak at 23.3° can be assigned to the PEO in the exemplary composite films, as shown in FIG. 6. With reference to FIG. 4B, the peak in the PL spectrum 500 and the sharp transition in the absorption spectrum 505 both appear at 545 nm wavelength, correlating with the band gap of the Br-Pero (2.3 eV). The PL spectrum 500 exhibits a full width at half maximum of 18 nm.

Figure 7A:
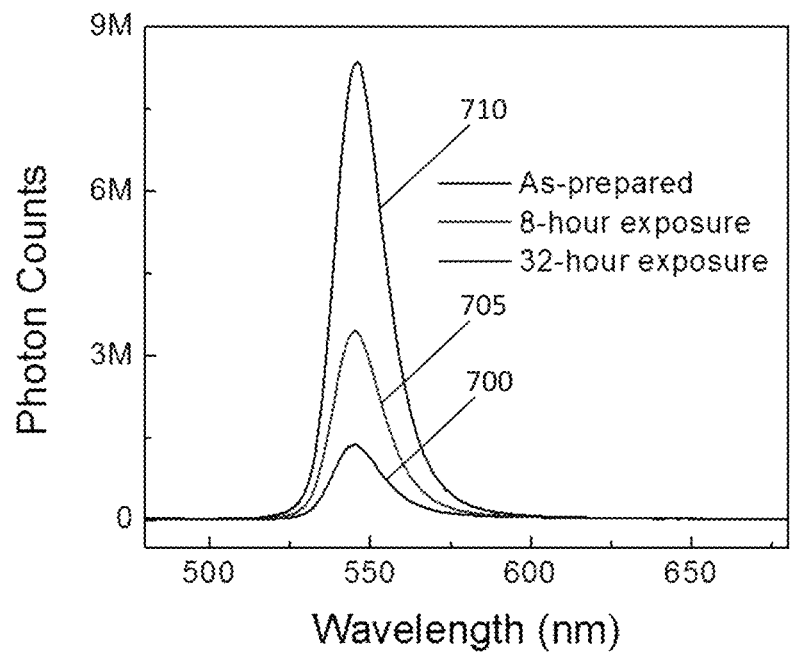
FIG. 7A is a photoluminescence spectra evolution for PEO/Br-Pero composite film (0.75:1), in accordance with an embodiment of the present invention.
Figure 7B:
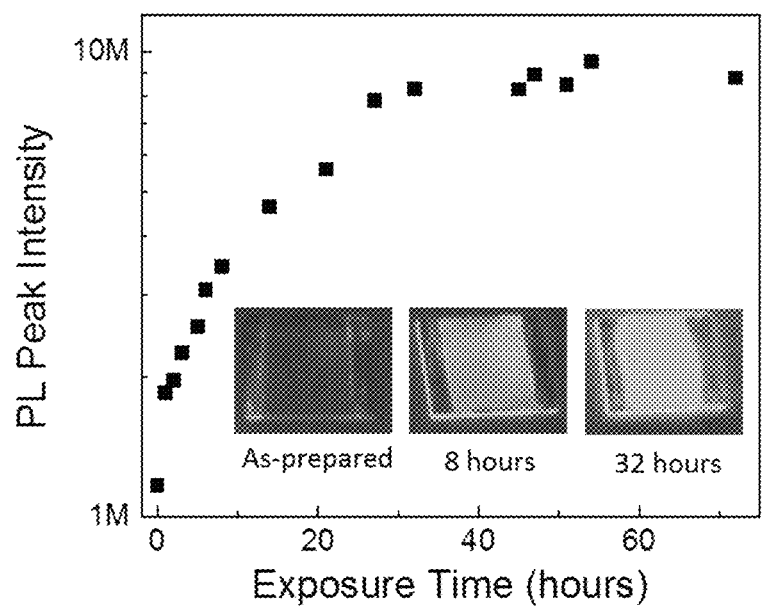
FIG. 7B is a peak intensity (at 545 nm) evolution with air exposure time for PEO/Br-Pero composite film (0.75:1), in accordance with an embodiment of the present invention

The stability of the PEO/Br-Pero (0.75:1) composite films have been investigated in ambient air at 25° C. and 70-85% relative humidity. With reference to FIG. 7A, photoluminescence spectra were collected immediately after processing 700, after 8 hours exposure in air 705 and after 32 hours exposure in air 710. As shown in FIG. 7B the peak intensity at 545 nm increased rapidly with exposure time and reached a saturation value at 32 hours 710, with a 612% increase of peak intensity compared to the as-prepared film 700. It was also found that the photoluminescence intensity remained nearly unchanged after exposing in air for 40 more hours.

Figure 7C:
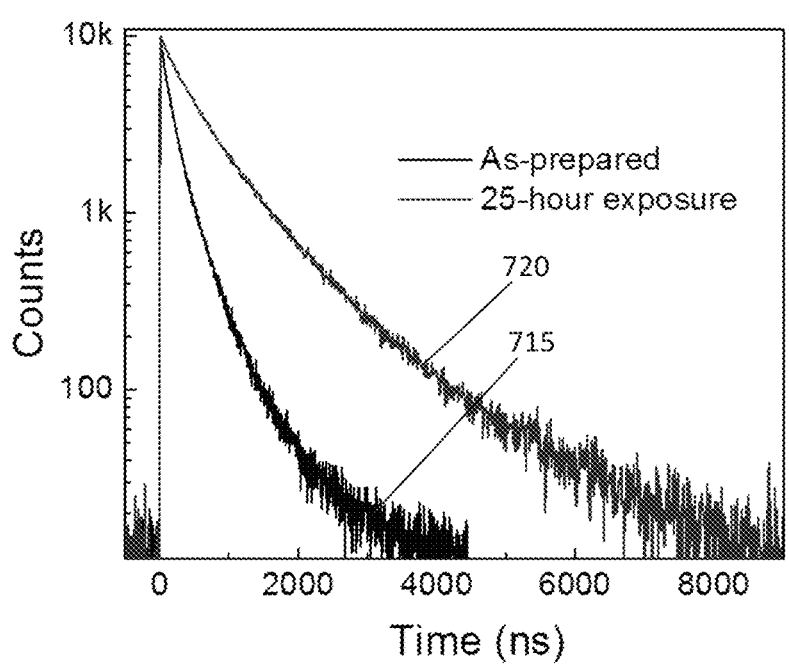
FIG. 7C illustrates time-resolved emission traces ($\lambda_{ex}$=405 nm, $\lambda_{em}$=545 nm) for one as-prepared film and after 25 hours of exposure to air, in accordance with an embodiment of the present invention.

The insets in FIG. 7B are photos of the as-prepared, 8-hour-air-exposure and 32-hour-air-exposure samples under 365-nm UV lamp irradiation, suggesting photoluminescence intensity enhancement after the air exposure. FIG. 7C illustrates time-resolved emission traces (λex=405 nm, λem=545 nm) for one as-prepared film 715 and after 25 hours of exposure to air 720. As a control experiment, another PEO/Br-Pero sample was printed and kept in a nitrogen filled glovebox with both oxygen and moisture concentration at 1 ppm. In the control experiment is was found that, compared with humid air, dry nitrogen only slightly improved the photoluminescence characteristic of the sample.

Figure 8A:
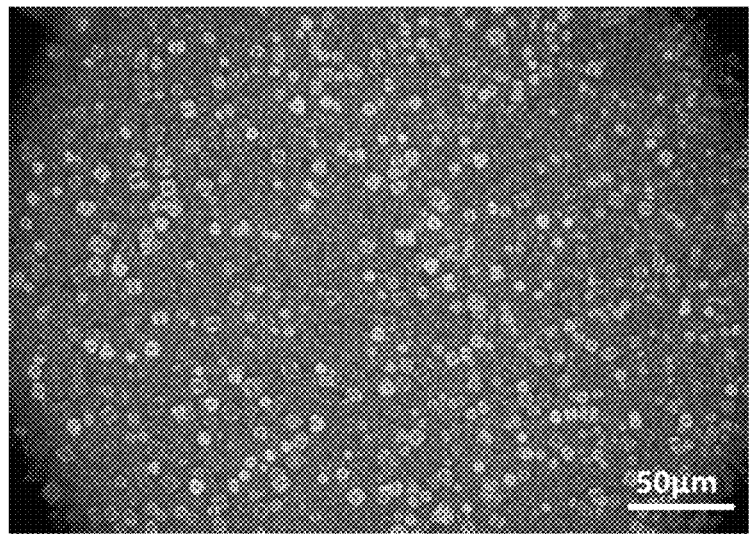
FIG. 8A is an optical microscopic image of a PEO/Br-Pero composite film (0.75:1) immediately after printing in air, in accordance with an embodiment of the present invention.
Figure 8B:
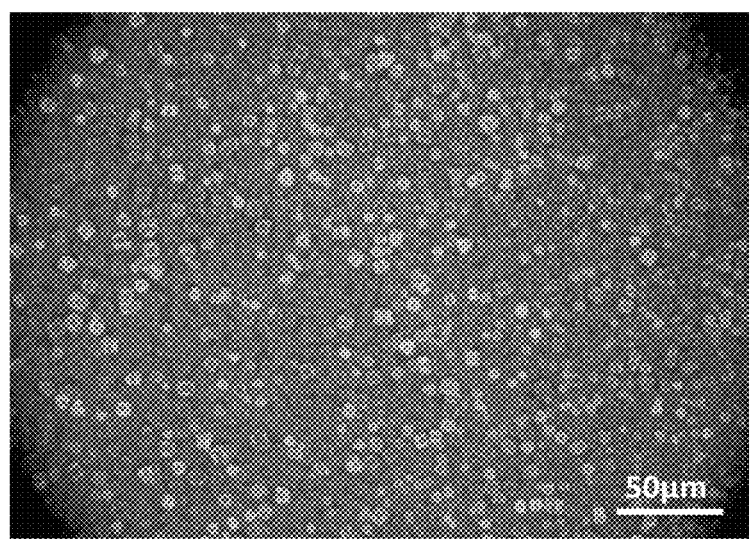
FIG. 8B is an optical microscopic image of a PEO/Br-Pero composite film (0.75:1) after 20 hours exposure in air, in accordance with an embodiment of the present invention.
Figure 9:
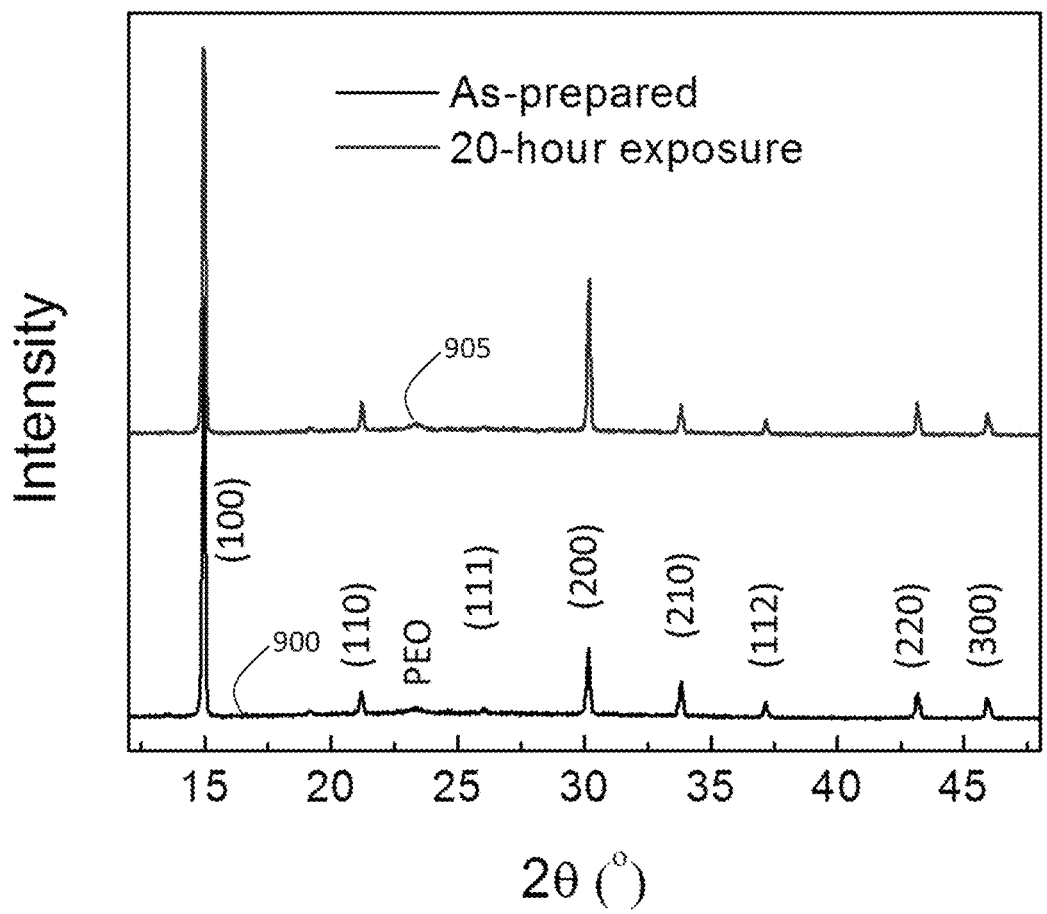
FIG. 9 illustrates XRD spectrum collected for an air exposed sample, in accordance with an embodiment of the present invention.

FIG. 8A and FIG. 8B illustrate the optical images of one PEO/Br-Pero (0.75:1) film immediately after printing in air and after 20 hour air exposure, respectively. It can be seen that the morphology of the film did not change after the air exposure. With reference to FIG. 9, an XRD spectrum was also collected for an air exposed sample 905 and is was found that all the peak positions were identical to the freshly printed film 900. Thus, the structural integrity of the Br-Pero crystals remained unaltered after air exposure.

Time-resolved photoluminescence (TrPL) spectroscopy was used to characterize the printed PEO/Br-Pero film. As shown in FIG. 7C the air exposed film had much longer lifetime than the as-prepared film, signifying a reduction of defect density in the bulk or/and at the interfaces of the Pero crystals after the air exposure, which contributed to the observed photoluminescence intensity increase. Humidity induced photoluminescence enhancement in I-Pero thin films has been previously reported, accompanied with a risk of deteriorating the morphology and composition of the Pero crystals. In contrast, forming a composite of PEO/Pero was superior in boosting the photoluminescence efficiency while maintaining the desired morphology and crystallinity at high humidity environment, which makes it ideal for ambient air printing processes.

Figure 10A:
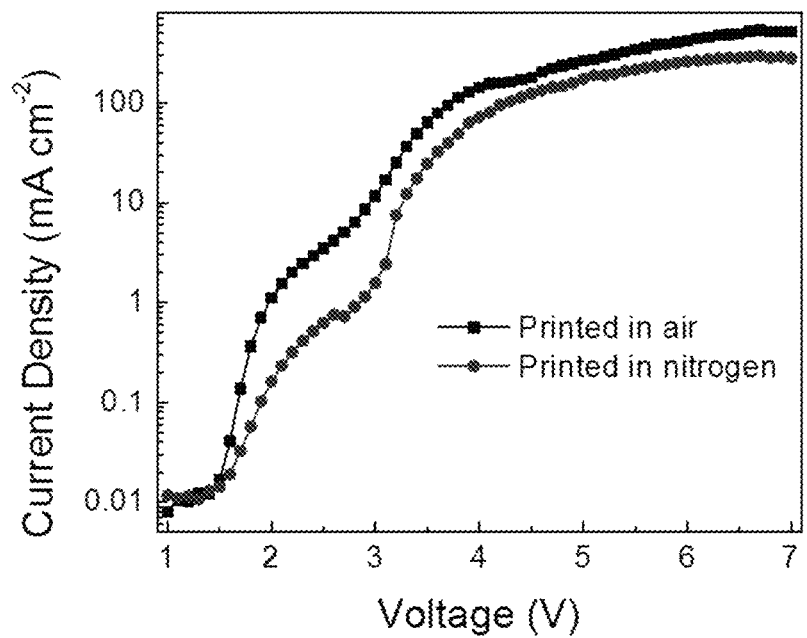
FIG. 10A is a graphical illustration of current density of the best performing LEDs printed in air and in a nitrogen filled glovebox, in accordance with an embodiment of the present invention
Figure 10B:
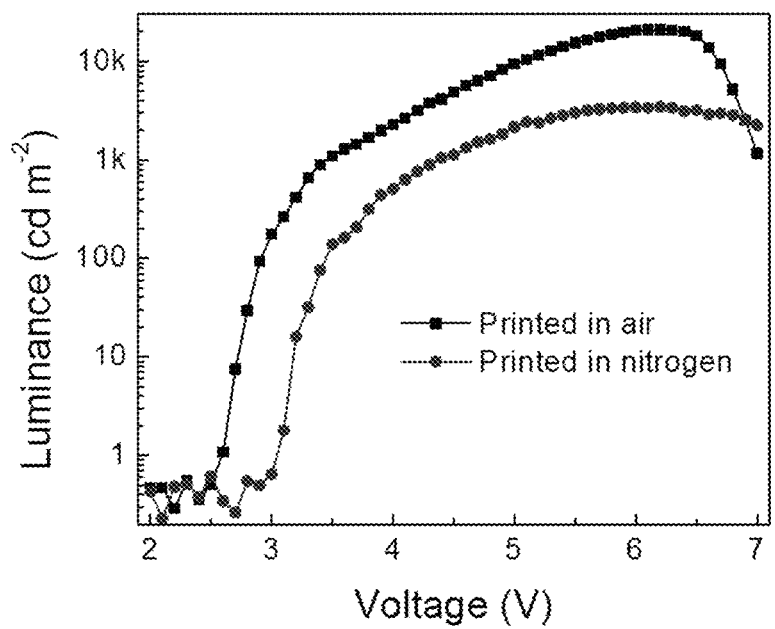
FIG. 10B is a graphical illustration of luminance of the best performing LEDs printed in air and in a nitrogen filled glovebox, in accordance with an embodiment of the present invention.
Figure 10C:
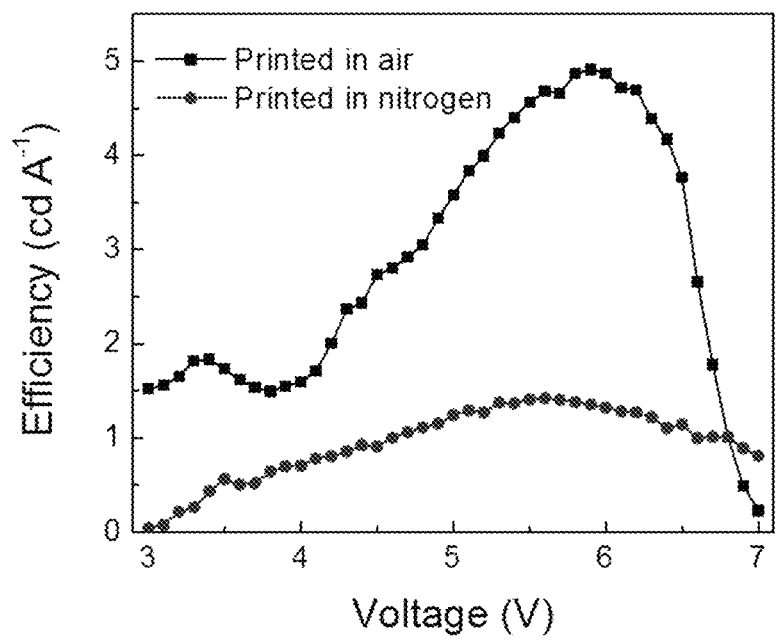
FIG. 10C is a graphical illustration of current efficiency versus voltage characteristics of the best performing LEDs printed in air and in a nitrogen filled glovebox, in accordance with an embodiment of the present invention.
Figure 11A:
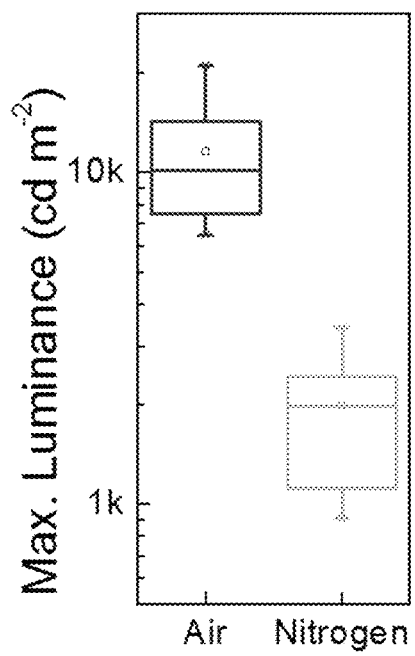
FIG. 11A presents statistical summaries of maximum luminance intensity for all the devices printed in air and in the nitrogen filled glovebox.
Figure 11B:
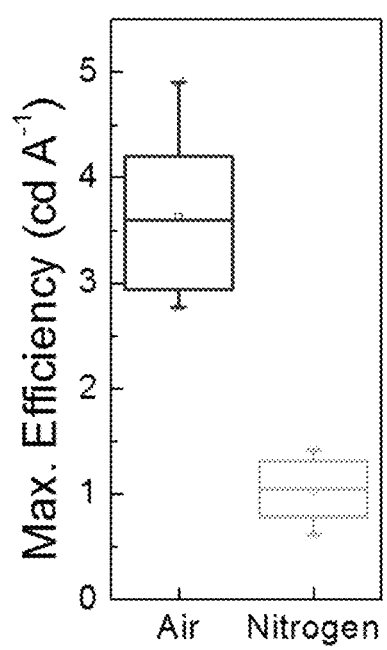
FIG. 11B presents maximum current efficiency for all the devices printed in air and in the nitrogen filled glovebox.

In an exemplary embodiment, printed LED devices were fabricated and characterized using composite PEO/Br-Pero films with a 0.75:1 weight ratio in the emissive layer. The films were printed and kept in air (25° C., 70-85% relative humidity) for 32 hours before the top AgNW electrode was printed. In this exemplary embodiment, a total of seven devices were prepared. As a control experiment, seven LEDs were also printed in the nitrogen filled glovebox. The current density-voltage (I-V), luminance-voltage (L-V), and current efficiency-voltage (E-V) characteristics of the best performing LEDs printed in air and in nitrogen glovebox are shown in FIG. 10A, FIG. 10B, and FIG. 10C, respectively. In addition, statistical summaries of both maximum luminance intensity ($L_{max}$) and maximum current efficiency ($E_{max}$) are presented in FIG. 11A and FIG. 11B for all seven devices in each group.

Overall, the devices printed in air exhibited higher current density than the devices printed in nitrogen. It is conjectured that air exposure may be effective in reducing surface defects in the Pero crystals, leading to improved electron/hole injection efficiency across the electrode/Pero interfaces. The devices printed in air exhibited a turn-on voltage of 2.6V, an $L_{max}$ of 21,014 cd m$^{-2}$ (at 6.2V), and $E_{max}$ of 4.91 cd A$^{-1}$ (at 20,000 cd m$^{-2}$ luminance intensity), which is equivalent to an EQE of 1.1%. All the seven air-printed LEDs had average $L_{max}$ of 11,576 cd m$^{-2}$, $E_{max}$ of 3.63 cd A$^{-1}$, and EQE of 0.8%. In contrast, the best among all the devices printed in nitrogen glovebox had a turn-on voltage of 3.1V, an $L_{max}$ of 3,446 cd m$^{-2}$ (at 6.2V), and $E_{max}$ of 1.42 cd A$^{-1}$ (at 3,175 cd m$^{-2}$ luminance intensity), which is equivalent to an EQE of 0.3%. All seven nitrogen-printed LEDs had average $L_{max}$ of 1,982 cd m$^{-2}$, $E_{max}$ of 1.02 cd A$^{-1}$, and EQE of 0.2%. It is evident that the device printed in air is superior to the one printed in the glovebox. On average, 256% enhancement in EQE and 484% enhancement in $L_{max}$ had were obtained after air exposure, which agrees with the large photoluminescence intensity increase in the air exposed PEO/Br-Pero film.

Turn-on voltages of 3.1V to 4.2V have been commonly reported by various research groups using a multi-layer device structure and a spin-coated Br-Pero thin film as the emissive layer. The much lower turn-on voltages in the air-printed devices of the present invention indicate that very efficient charge carrier injection can be achieved in Pero LEDs that have a relatively thick emissive layer (3-4 μm) and a very simple single-layer device structure. The combination of high efficiency and high luminance (an EQE of 1.1% at 20,000 cd m$^{-2}$) of the best air-printed device of the present invention exceed all reported Pero LEDs currently known in the art.

Figure 12:
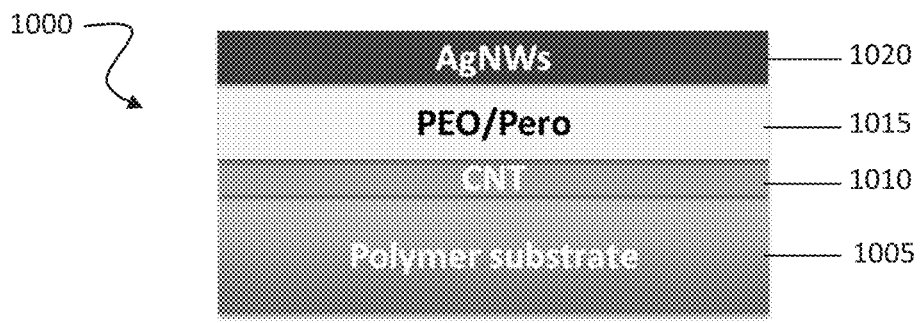
FIG. 12 is a diagram illustrating a device configuration for a printed and flexible PEO/Br-Pero LEDs on CNTs/Polyacrylate substrates, in accordance with an embodiment of the present invention

In a particular embodiment, fully printed and flexible PEO/Br-Pero LEDs 1000 were fabricated having a device configuration as illustrated in FIG. 12, according to the procedure described with reference to FIG. 1. In this embodiment, a single-walled CNT 1010 electrode was formed on a polyacrylate substrate 1005 to serve as the transparent anode. The thickness of the polyacrylate substrate 1005 was about 200 μm. The PEO/Br-Pero composite layer 1015 was printed onto the CNTs/polyacrylate in air, followed by air exposure for 32 hours and then the silver nanowires 1020 were printed as the cathode electrode.

Figure 13A:
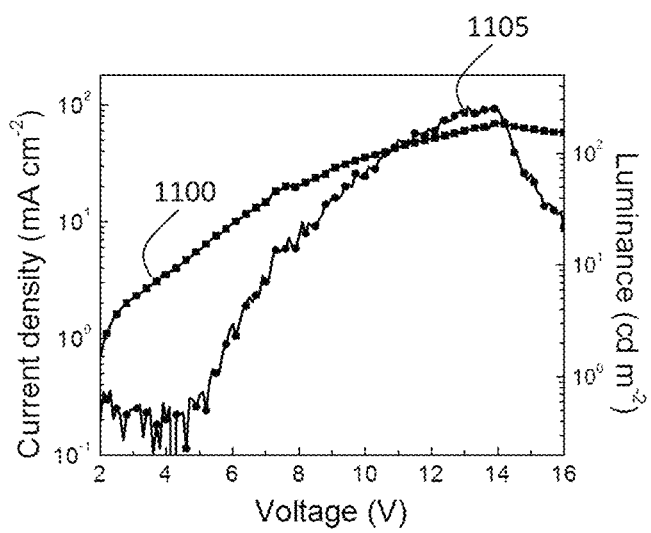
FIG. 13A is a graph of current density-voltage-luminance intensity characteristics of an exemplary flexible PEO/Br-Pero LEDs on CNTs/Polyacrylate substrates, in accordance with an embodiment of the present invention
Figure 13B:
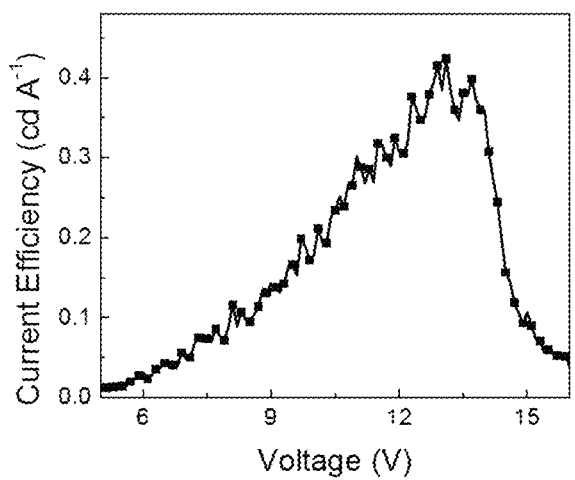
FIG. 13B is a graph of corresponding current efficiency-voltage characteristics of an exemplary flexible PEO/Br-Pero LEDs on CNTs/Polyacrylate substrates, in accordance with an embodiment of the present invention.

The working device 1000 bent to about 5 mm radius of convex curvature corresponding to applying 2% tensile strain onto the LED device. No luminous degradation was observed after 10 bending/releasing cycles. The I-V-L characteristics of the flexible device 1000 are shown in FIG. 13A. The exemplary device turned on at 5.5V and obtained a maximum brightness of 256 cd m$^{-2}$ at 13.9V. The maximum current efficiency was 0.42 cd A$^{-1}$, as show in FIG. 13B, which is equivalent to an EQE of 0.1%. The lower performance of the CNT/polymer based devices compared to devices on ITO/glass is attributed to a higher sheet resistance of the CNT network (~500-1,000 ohms square$^{-1}$). Nonetheless, the ultra-high flexibility of the CNT electrode is favorable for roll-to-roll printing of the PEO/Br-Pero layer on plastic substrates in the future.

In one exemplary embodiment, lead (II) bromide (99.999%), N,N-dimethylformamide (DMF) (anhydrous, 99.8%), poly(ethylene oxide) (Mw≈5,000,000), Bisphenol A ethoxylate diacrylate (Mn≈512), 2-2 dimethoxy-2-phenyl acetophenone (DMPA), and single-walled CNT conductive ink (SWeNT® VC101 ink) were purchased from Sigma-Aldrich. Polydimethylsiloxane (PDMS) precursors (SYLGARD® 182) were purchased from Ellsworth Adhesives. Silver nanowire dispersion in IPA (SLV-NW-90) was purchased from Blue Nano, Inc. The nanowires have an average diameter of 90 nm and length ~25 μm. The $CH_3NH_3Br$ was purchased from "1-Material Inc." All materials were used as received.

Static PL spectra were collected at room temperature on a Horiba Jobin Yvon FluoroMax-4 Fluorometer. Excitation wavelength was fixed at 460 nm. The emission spectra from 480 to 780 nm were collected with an integration time of 0.1 s. TrPL data were collected at room temperature using an Edinburgh FLS980 spectrometer. The dynamics of emission decay were monitored by using the FLS980's time-correlated single-photon counting capability (1024 channels; 10

μs window) with data collection for 10,000 counts. Excitation was provided by an Edinburgh EPL-405 picosecond pulsed diode laser (405.2 nm, 80 μs FWHM) operated at 1 MHz.

In the ITO/glass embodiment, the Br-Pero precursor solution was prepared by dissolving $PbBr_2$ and $CH_3NH_3Br$ with a 1:1.5 molar ratio in anhydrous DMF to give a concentration of approximately 500 mg $mL^{-1}$. PEO was dissolved in DMF to give a concentration of 10 mg $mL^{-1}$. The Perovskite precursor and PEO solutions were then mixed with the desired ratio. All the solutions were stirred for 30 min at 70° C. before use. The ITO/glass substrates (10Ω $square^{-1}$, 16 mm×18 mm size) were cleaned with detergent water, sonicated for 10 minutes each in acetone, IPA and distilled water and then blow dried with nitrogen. Cleaned ITO/glass substrates were treated with oxygen plasma at 100 W power for 3 minutes. 40 μl of composite solution was dropped onto the ITO/glass substrate and spread uniformly with a blade, then dried at 80° C. for 5 minutes on a hot plate. Kapton tape was cut into desired shape and dimensions using a laser cutting machine which served as a mask and was applied onto the composite film. 4 μl of silver nanowire suspension (50 mg $mL^{-1}$ in IPA) were dropped onto the electrode area defined by the Kapton mask and spread uniformly using another blade. The devices were then annealed at 80° C. for 1 minute before test. Device testing was done inside a nitrogen filled glovebox with both nitrogen and oxygen concentration at about 1 ppm.

In the CNT/polymer embodiment, the single-walled CNT conductive ink was printed onto a cured PDMS substrate using a Meyer rod and dried at 100° C. for 10 minutes. Photo curable monomers (bisphenol A ethoxylate diacrylate) mixing with 1 wt % of a photo-initiator (DMPA) were applied onto the CNTs/PDMS. The monomers were subjected to UV irradiation and cured into a solid polyacrylate film. By this process the CNTs became attached to the polyacrylate which was then peeled off from the PDMS. The CNTs on polyacrylate (500-1,000 ohms $square^{-1}$) sheet resistance and 60-70% transmittance at 550 nm) serves as the electrode/substrate for the fully printable LEDs.

Current density-voltage and luminance-voltage characteristics were measured with a Keithley 2400 source meter and a silicon photodiode. The silicon photodiode was further calibrated by a photo research PR-655 spectroradiometer.

The present invention demonstrates that Pero LEDs may be manufactured using a screen printing type process utilizing the contact mask to define the cathode layer. As such, the printed Pero LEDs can be produced at a very low cost (about 10-50 cents/$ft^2$), can be printed on large areas (10 ft×10 ft or more), can be produced using high throughput manufacturing (10 ft×10 ft per minute), can be ultra-thin and lightweight (0.1 mm thick including the LEDs and packaging, and weighing about 3 lb per 10 ft×10 ft), can be produced on flexible substrates and curved surfaces (printing on paper, clothing, glass/metal/plastic bottles, windshields, concrete, etc.), and can be produced with a choice of colors (red, green, blue, white, or mixtures thereof). Potential applications of the present disclosure include, but are not limited to, LED light bulbs, LED safety signage, LED displays and screens, LED camouflage, and LED decorations (walls, windows, postcards, credit cards, toys).

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method for manufacturing an optoelectronic device, the method comprising:
    placing a poly(ethylene oxide) (PEO) organometallic halide Perovskite (Pero) solution onto and in contact with a transparent electrode substrate;
    spreading the PEO/Pero solution substantially uniformly across at least a portion of the transparent electrode substrate to form an emissive layer that is on and in contact with the transparent electrode substrate;
    positioning a contact mask in overlying relation to the emissive layer, the contact mask dimensioned and patterned to define a patterned electrode;
    placing a metallic nanowire solution onto the contact mask; and
    spreading the metallic nanowire solution substantially uniformly across the contact mask to form the patterned electrode, wherein the patterned electrode is on and in contact with the emissive layer.

2. The method of claim 1, wherein the method is performed in an environment having a temperature of about 25° C. and a relative humidity between about 70% and 80%.

3. The method of claim 1, wherein the transparent electrode substrate comprises an indium tin oxide (ITO) electrode on a glass substrate.

4. The method of claim 1, wherein the transparent electrode substrate comprises a carbon nanotube (CNT) electrode on a polyacrylate substrate.

5. The method of claim 1, wherein the transparent electrode substrate is about 200 μm thick.

6. The method of claim 1, wherein the PEO/Pero solution comprises PEO and methyl ammonium lead tri-bromide (Br-Pero).

7. The method of claim 1, wherein a solvent of the PEO/Pero solution is dimethylformamide (DMF).

8. The method of claim 1, further comprising annealing the PEO/Pero solution after spreading the PEO/Pero solution substantially uniformly across at least a portion of the transparent electrode substrate to remove a solvent from the PEO/Pero solution.

9. The method of claim 1, wherein the emissive layer is between about 3 μm and 4 μm thick.

10. The method of claim 1, wherein a ratio of PEO to Pero in the PEO/Pero solution is about 0.75:1.

11. The method of claim 1, wherein the metallic nanowire solution is a silver nanowire (AgNW) solution.

12. The method of claim 1, wherein a solvent of the metallic nanowire solution is isopropanol (IPA).

13. The method of claim 1, further comprising annealing the metallic nanowire solution after spreading the metallic nanowire solution substantially uniformly across the contact mask to form the patterned electrode on the emissive layer to remove a solvent from the metallic nanowire solution.

14. The method of claim 1, wherein the patterned electrode is about 300 nm thick.

15. A method for manufacturing a light emitting diode (LED), the method comprising:
    placing a poly(ethylene oxide) (PEO) methyl ammonium lead tri-bromide (Br-Pero) solution onto and in contact with a transparent electrode substrate, wherein the PEO/Br-Pero solution comprises a dimethylformamide (DMF) solvent;

spreading the PEO/Br-Pero solution substantially uniformly across at least a portion of the transparent electrode substrate to form an emissive layer that is on and in contact with the transparent electrode substrate;

annealing the PEO/Br-Pero solution to evaporate the DMF solvent;

positioning a contact mask in overlying relation to the emissive layer, the contact mask dimensioned and patterned to define a patterned electrode;

placing a silver nanowire (AgNW) solution onto the contact mask, wherein the AgNW solution comprises an isopropanol (IPA) solvent;

spreading the AgNW solution substantially uniformly across the contact mask to form the patterned electrode, wherein the patterned electrode is on and in contact with the emissive layer; and annealing the AgNW solution to remove the isopropanol (IPA) solvent from the AgNW solution.

16. The method of claim 15, wherein the method is performed in an environment having a temperature of about 25° C. and a relative humidity between about 70% and 80%.

17. The method of claim 15, wherein a ratio of PEO to Br-Pero in the PEO/Pero solution is about 0.75:1.

18. The method of claim 15, wherein the metallic nanowire solution is a silver nanowire (AgNW) solution.

19. An optoelectronic device comprising:
a transparent electrode substrate;
a substantially uniform printed poly(ethylene oxide) (PEO) organometallic halide Perovskite (Pero) emissive layer on and in contact with the transparent electrode substrate; and
a substantially uniform printed and patterned electrode on and in contact with the emissive layer.

20. The optoelectronic device of claim 19, wherein a ratio of PEO to Pero in the PEO/Pero solution is about 0.75:1.

* * * * *